Oct. 30, 1962 M. SKOLNICK 3,061,526

ELECTRO-PLATING METHOD AND APPARATUS

Filed March 18, 1959

INVENTOR.
MAX SKOLNICK

BY: [signature]

ATTORNEY

United States Patent Office 3,061,526

Patented Oct. 30, 1962

3,061,526
ELECTRO-PLATING METHOD AND APPARATUS

Max Skolnick, 104—60 Queens Blvd., Forest Hills, New York 75, N.Y.

Filed Mar. 18, 1959, Ser. No. 800,346
7 Claims. (Cl. 204—15)

This invention relates to electroplating techniques and apparatus and, more particularly, to techniques and apparatus for the preparation of plated structures such as printed circuits and the like having pluralities of juxtposed platable elements.

It is an object of the invention to provide improved methods and apparatus relating to electroplating techniques whereby known techniques may be basically modified and electroplating operations facilitated.

The invention is primarily concerned with the plating of printed circuits. Thus, although the invention is applicable to other fields such as the plating of costume jewelry and the like, the following disclosure will be limited to printed circuits. This limiting of the disclosure is intended only to facilitate a comprehension of the invention and is possible because the problems which beset the manufacture of plated printed circuits are common to other fields as well.

A finished or partially finished printed circuit generally consists of a flat board of insulating material such as plastic upon which are superposed small islands of an electrically conductive material such as copper. These islands or conductive elements are generally rather small and may be very closely positioned. They are therefore very difficult to plate. Furthermore, the techniques by which they are formed do not readily lend themselves to associated plating operations.

In the formation of the above-noted islands, a lamination of a conductive material such as copper on a plastic sheet or board is normally covered by a pattern of masking or resist material. This pattern is designed to shield the islands from a corrosive material which is subsequently employed to etch or remove the conductive material from between the islands. If the islands are to be electroplated, it is conventional to mask off instead all but the islands themselves, plate the islands and then use the plating as the resist material for a subsequent etching operation.

It is conventional to plate the islands prior to the etching operation because of the very many difficulties inherent in plating the same after the etching operation has been effected. After the etching operation, the islands are isolated conductive elements each of which must be individually connected to a cathode or anode whereas, if the conductive coating of the lamination is plated while it is intact and before etching, only one electrical connection with the coating is necessary for the plating operation. Unfortunately, the technique of plating before etching leads to many undesirable consequences which it is an object of this invention to avoid. For example, if a metal coating is first plated in accordance with a pattern of islands and then etched, the resulting islands have only a superposed coating and the base metal of the islands is laterally exposed.

Moreover, the masking materials which are employed prior to plating generally affect the conditions under which plating may be performed. For example, lower temperatures must be employed for the plating operation so as not to destroy the masking material and this, of course, slows down the plating rate.

Still further, different plating materials may require the use of different etching materials which do not destroy the plating. This obviously prevents a standardization with respect to materials employed and results in the need for procuring and storing materials which may only infrequently be used.

Additionally, in contrast to the conventional technique, plating after etching enables the use of higher potentials and currents than normally are employed, since there is no limitation due to masking materials and, for the same reason, the most efficient type of cleansing agent can be employed on the metal layer of the lamination.

The objects of the invention include avoiding the above-noted deficiencies of conventional electroplating techniques while at the same time securing the above-listed benefits.

Briefly, the invention achieves the above and other of its objectives by providing for plating after etching, as was heretofore believed impossible, or, in other words, by providing for the plating of small closely positioned islands or conductive elements.

The invention is further characterized in that, for example, it provides mass production techniques whereby a single fixture may be employed for plating large numbers of like printed circuits with only a single set up being required.

Moreover, the invention provides fixtures which are readily adapted for use with different types of printed circuits so that, although a fixture is employed with one pattern of islands, the fixture is not necessarily limited thereto and may be employed for other patterns.

Other objects, advantages and features of the invention will become apparent from the following detailed description of preferred forms of the apparatus of the invention as illustrated in the accompanying drawing in which.

Figure 1:
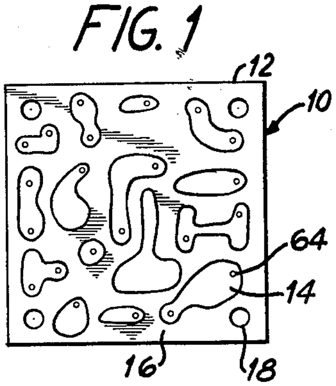
FIG. 1 is a top plan view of a printed circuit illustrating an arbitrary design therefor.

In FIG. 1 is illustrated a printed circuit generally indicated at 10. The printed circuit consists of a sheet or board 12 which may, for example, by a phenolic resin or the like, upon which are positioned small islands or conductive elements 14 which are generally made of copper.

Normally, the printed circuit 10 is fabricated from a lamination of copper on the sheet 12. If no plating operation is to be involved, an island is masked off on the copper layer so as to expose only the sections 16 intermediate the islands 14. The islands 14 are, therefore, covered with a material which is capable of resisting an etching fluid. The printed circuit is then exposed to an etching fluid such that all the copper except that constituting the islands 14 is eaten away, and the remaining copper is then cleansed of the masking material.

If a plating operation is to be effected (i.e., the islands 14 are to be plated with a material such as, for example, gold, silver, indium, nickel or the like), the above-indicated operation is somewhat modified. A masking material is employed which resists plating and the sections 16 between the islands 14 are covered, leaving only the islands 14 exposed. The printed circuit is then placed in an electroplating bath and the islands 14 alone are plated. The plating on the islands 14 is then used as a resist material for a subsequent etching operation which is effected to etch away the copper in between the various islands.

In accordance with the method contemplated by the invention, however, the printed circuit is etached prior to the plating operation. Thus, islands 14 are covered with a masking or resist material, and sections 16 are etched away. Islands 14 are then cleansed of the masking material and are plated.

It will be noted that the islands 14 are comparatively small bodies of conductive material and that they are positioned rather closely. This, of course, makes a plating operation rather difficult, inasmuch as it is necessary to contact each and every one of the islands to be plated with an electrode. The islands 14 must be so contacted because, as is well known, an electroplating operation requires that each element to be plated be so arranged in an electrical circuit including an electroplating bath as to be capable of conducting an electrical current.

Because of the difficulty in contacting the islands 14 on a printed circuit, the method consisting of plating after etching has not been popular in industry. It is contemplated by the invention, however, that this operation be greatly facilitated so as to become a practical method for purposes of securing the benefits listed above. One of the structural embodiments of the invention which facilitates plating after etching is indicated in FIGS. 2–5. Before examining these figures, however, it is to be noted, in FIG. 1, that the sheet 12 is provided with four alignment holes 18 which are positioned at the four corners of the quadrilateral representing the configuration of the printed circuit. In this regard, however, it is to be noted that these alignment holes may differ in number and position from the arrangement illustrated, the structure of the invention being readily adapted to cooperate with any pattern of alignment holes selected.

Figure 2:
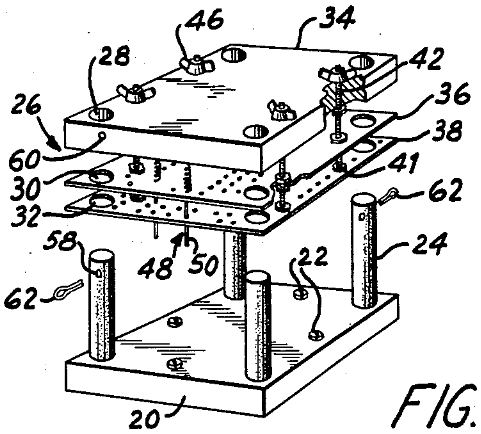
FIG. 2 is an exploded perspective view of an electroplating fixture provided in accordance with the invention.
Figure 3:
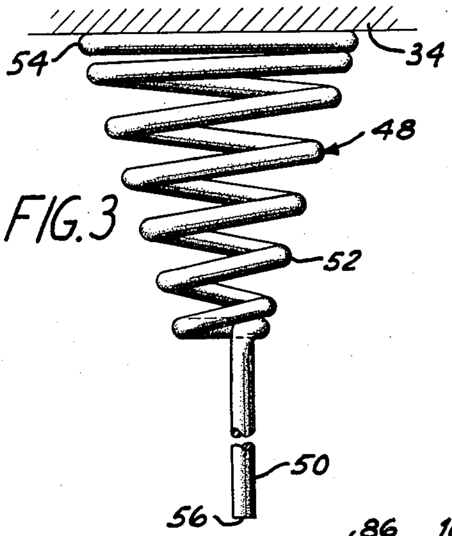
FIG. 3 is a side view of an electrode employed in the apparatus of FIG. 2 and illustrating the relationship thereof in the structure.

In FIG. 2 is illustrated a plate 20 which constitutes a support means for the printed circuit of FIG. 1. On the plate 20 are positioned four posts or screw heads 22 which serve to accommodate the alignment holes 18 of the printed circuit of FIG. 1. Posts 22, therefore, constitute alignment means and may be positioned in accordance with any predetermined pattern so as to accommodate each of a series of printed circuits 10 which are to be plated in sequence by the use of mass production techniques. It will be appreciated that any number of posts 22 may be provided and it will be further appreciated that the plate 20 can be provided with a pattern of holes in which the post 22 may be selectively positioned in accordance with the type of printed circuit which is to be plated.

On the plate 20 are further positioned four posts 24. These posts also constitute alignment means but are not intended to engage the printed circuits, since this function has been ascribed to the posts 22. Posts 24 are, instead, intended to accommodate a detachable unit generally indicated at 26. For this purpose, unit 26 is provided with holes 28, 30 and 32, by means of which the unit is guided on to post 24 in preparation for a plating operation, as will hereinafter be indicated in greater detail.

Unit 26 comprises a cover plate 34 which serves as a supporting means for electrodes employed as indicated above. It will be noted that in a preferred form the plates 20 and 34 are planar rectangular members, which facilitates their preparation and manufacture. These plates are preferably of a conductive material, such as stainless steel, which will resist a plating operation and hence will result in substantial savings of deposited material, which may be, for example, one of the noble metals.

Immediately below the plate 34 are positioned two grids 36 and 38. The grids 36 and 38 are preferably of a metal such as stainless steel, but may as well be of a plastic or other non-conductive material, providing that a sufficient structural strength is afforded.

Figure 4:
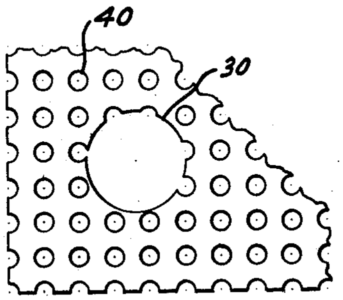
FIG. 4 is a top plan view of a part of an element of the structure of FIG. 2.

FIG. 4 illustrates a preferred pattern of apertures provided for grids 30 and 32, these grids being substantially identical. In FIG. 4 is indicated a guide hole 30, such as has been indicated above with respect to FIG. 2. Also indicated are a plurality of apertures or guide holes 40, the function of which will become hereinafter apparent. It is sufficient to note at this point that the apertures 40 are arranged in symmetrical fashion at the intersection of equally spaced abscissae and ordinates of a grid or chart. This provides the structure of the invention with a high degree of selectivity, especially so since these apertures may be spaced by a distance of, for example, $\frac{1}{32}$ of an inch. Alternatively, however, the structure of FIG. 4 may be provided, for example, in the form of a single block of clear plastic through which holes are bored in accordance with the pattern of platable elements.

Grids 36 and 38 are arranged in parallel to one another, as well as in parallel to plate 34. Consequently, one of the grids (for example, the grid 36) is positioned intermediate the other of the grids and plate 34. Moreover, grids 36 and 38 are spaced at a distance which may be, for example, around ¼ of an inch.

The grids 36 and 38 (or the substitute suggested above) and the plate 34 constitute most of the essential elements of unit 26 and, although these essential elements may be permanently affixed to one another in accordance with the indicated spacing, they are preferably arranged in detachable manner with respect to one another by means which are independent of those means provided for connecting the unit 26 with the posts 24.

An example of one type of connecting structure which may be employed to connect the grids to the cover plate 34 is illustrated in FIG. 2, wherein, for example, can be seen bolts 42 which extend through the cover plate and grids in a direction which is preferably perpendicular thereto. On bolts 42, which are threaded, are provided a series of nuts 44 which are employed to space the cover plate and grids properly on the bolts and connect the same together in a substantially rigid manner. If desired, the ends of the bolts may be threadably accommodated in holes provided in cover plate 34 or, as illustrated, wing nuts 46 may be provided for locking the unit 26 together.

With the grids 36 and 38 affixed to the cover plate 34, there is provided intermediate the grid 36 and cover plate 34 a spacing having a particular use in accordance with the invention. This use will next be explained with reference to the electrodes 48, which are shown in greater detail in FIG. 3. Each electrode consists of a pin 50 which is of very fine diameter, such as for example $\frac{20}{1000}$ of an inch. Each pin 50 is connected with a resilient device, such as illustrated in the form of a helical spring 52 in FIG. 3. Helical spring 52 is provided with a flattened end turn 54 which thus provides the associated spring 48 with a planar abutment surface. This planar abutment surface is intended to rest against the bottom surface of the cover plate 54. Moreover, the spacing between grid 36 and the bottom surface of cover plate 34 is such as to retain the spring 52 under compression, so as to maintain the associated electrodes firmly but yieldably in position. It is to be noted that, if desired, the electrodes 48 may be made of a heavier wire than has been indicated above, and in such case the free ends 56 of the electrodes will be tapered to very nearly a point such that only a very small area of contact exists between the islands 14 and the electrodes 48.

From what has been indicated above, it will be appreciated that the electrodes 48 constitute, with the grids 36 and 38 and the cover plate 34, a unit which is alignable with the plate 20 by means of posts 24 and alignment holes 28, 30 and 32. It is, of course, desired for any given plating operation of a series of plating operations that the unit 26 be rather firmly fixed in position. For this purpose, holes 58 may be provided in posts 24, in correspondence with holes 60 which are perpendicularly directed into holes 28 in the cover plate 34. Pins 62 may then be provided for insertion through holes 58 and 60 to lock the unit 26 on the posts 24.

For a set up operation, posts 22 are arranged on plate 20 to correspond with alignment holes 18, which are present in identical arrangement in each of a large number of printed circuits 10 which have previously been etched. One of the printed circuits 10 is then positioned on the posts 22, with the unit 26 removed from the posts 24. The islands 14 are directed upwardly. Preferably, the cover plate 34 is removed from the unit 26, this being readily accomplished by removal of the wing nuts 46. Grids 36 and 38 are then positioned on the posts 24 and are, therefore, superposed with respect to the printed circuit 10 being employed. The pins 50 of electrodes 48 are then selectively inserted through the apertures 40 of grids 36 and 38, in accordance with a visual sighting of the islands 14. Preferably, one electrode 48 only is assigned to each island 14 and advantageously the selection of the position of each electrode 48 may be made with respect to soldering holes 64 provided in the printed circuit.

When the above operation has been completed and an electrode has been assigned to each of the islands 14, the cover plate 34 is positioned on the bolts 42 and the wing nuts 46 are applied to the latter. This places the springs 52 under compression and the electrodes 48 are firmly but yieldably positioned for an electroplating operation.

It will be appreciated that islands 14 may have some variation in height (i.e., they may extend slightly varying distances above the surface of sheet 12). These variations will, however, be readily accommodated by helical springs 52, which will maintain pins 50 in contact with their associated islands.

It will be moreover appreciated that if a mass production type of electroplating operation is to be effected on a series of identical printed circuits, the electrodes 48 maintain their respective positions while the unit 26 is removed or loosened to permit the removal of one printed circuit and the substitution of the next.

Accordingly, the invention greatly facilitates a plating operation where the plating is to be effected after the islands 14 have already been formed. Moreover, it will be seen that the arranging of the electrodes in selected positions corresponding to the islands 14 is a very simple matter. Still further, it is to be observed that the detaching of the unit 26 from the plate 20 affords a very simple technique, whereby a plating fixture may be reemployed in a sequence of like plating operations on a sequence of like printed circuits.

An electroplating operation generally involves the positioning of the elements to be plated in an electroplating bath. For an efficient electroplating operation, the fluid of the bath should have a free path of movement past the platable element. For this reason, the pins 50 are made of a sufficient length that the lower of the grids (namely, grid 38) is spaced substantially from the plate 30 during a plating operation, so that the fluid of the bath may move freely between the grid 38 and the plate 20.

In general, it can be observed that the invention provides a first support means (the plate 20) for supporting platable elements (the islands 14) in fixed position, and a second supporting means (the cover plate 34) for supporting the electrodes 48 in respective positions corresponding to the pattern of the islands 14. Moreover, it may be observed that the fixture of the invention comprises alignment means (the posts 24 and associated holes) which enable the unit 26 to be repeatedly connected to and separated from the plate 20, while maintaining a constant attitude with respect to the plate 20 when affixed thereto.

It is also to be observed, as indicated above, that the electrodes 48 are resilient electrodes which yield to the pressure exerted between the islands 14 and the electrodes, in order to maintain contact therewith while accommodating irregularities in the islands. It is to be understood that the electrodes 48 are of a metal such as, for example, stainless steel, which will resist the depositing of the plating material. Alternatively, the electrodes may be of nickel, chrome, tungsten or the like.

The use of a symmetrical pattern of guide holes in the grids 36 and 38 permits the positioning of electrodes 48 as desired. Of course, for any electroplating operation of great magnitude, grids 36 and 38 may be provided with a predetermined arrangement of guide holes, rather than a symmetrical arrangement of the same. Moreover, electrodes 48 can, if desired, be permanently positioned.

Grids 36 and 38, therefore, constitute with the apertures 40 a guide means, by means of which electrodes 48 may be selectively positioned.

Figure 5:
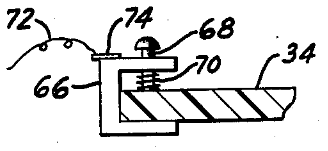
FIG. 5 illustrates an electrical connection to the structure of FIG. 2.

In FIG. 5 is illustrated a portion of the cover plate 34 which, as noted above, is a metallic and, therefore, electrically conductive material. An electrical connection to the cover plate 34 will, therefore, be connected to the free ends 56 of the electrodes 48. Such an electrical connection is indicated, by way of example, in FIG. 5 in the form of a metal bracket 66 which supports a movable contact 68 loaded by a spring 70. To the bracket 66 is connected an electrical line 72, the connection being indicated at 74. Any potential applied to line 72 will result at the free ends 56 of each of the electrodes 48.

Figure 6:
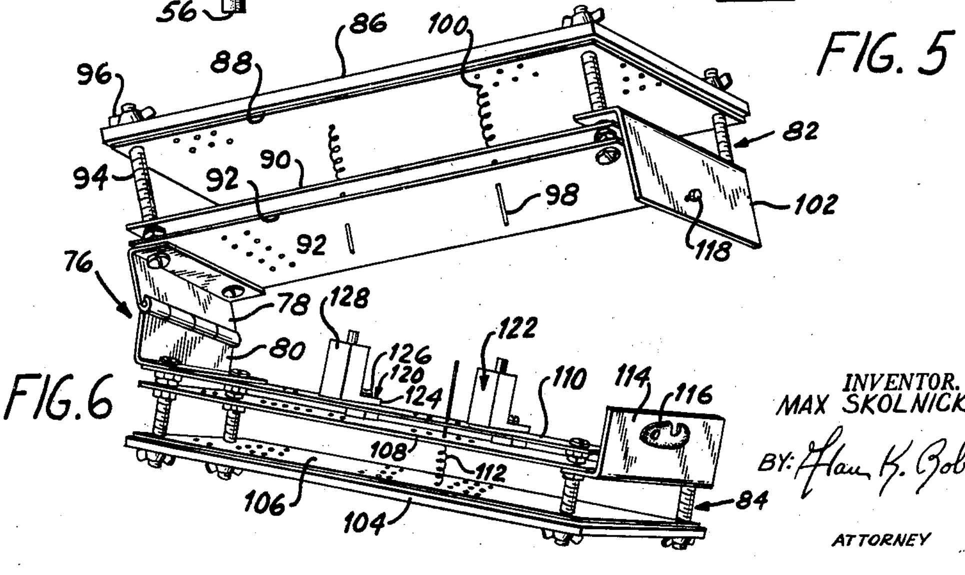
FIG. 6 illustrates a second type of fixture provided in accordance with the invention.

FIG. 6 illustrates a second embodiment of the invention which can be used in the event that metal islands 14 are provided on both faces of sheet 12.

The structure of FIG. 6 comprises a hinge member generally indicated at 76 and comprising pivotally connected brackets 78 and 80. Units 82 and 84 are connected to brackets 78 and 80 for pivotal movement towards and away from one another. The unit 82, for example, consists of a cover plate 86, beneath which may be positioned a grid 88 and to which are connected grids 90 and 92. Grids 90 and 92 are spaced in parallel with respect to each other and are spaced from and parallel to the cover plate 86. Bolts 94 and wing nuts 96 are employed as indicated above for maintaining the elements of this unit together.

Electrodes 98 are employed in the unit 82 and consist of pins and helical springs, as previously indicated. The helical springs of the electrodes 98 may have flat extremities for abutment against the cover plate 84, but may instead be provided with axial extensions 100 engaging in the grid 88 for purposes of restricting movement of the electrodes 98. Unit 82 is provided with a bracket 102, for reasons which will hereinafter be explained.

The electroplating fixture illustrated in FIG. 6 substitutes for the plate 20 of FIG. 2 the hinged unit 84 which, in a manner similar to the unit 82, is provided with a cover plate 104 and grids 106, 108 and 110. Electrodes 112 are positioned in the same manner as electrodes 98, which are positioned in a manner which is similar to that for electrodes 48 of FIG. 2.

Unit 84 is provided with a bracket 114 having a pivotal latch 116, the purpose of which is to engage a pin 118 provided with bracket 102, so that the units 82 and 84 may be locked together for a plating operation.

On grids 92 and 110 may be provided in any desired arrangement, one of which is illustrated, supports 120 and 122. Supports 120 and 122 may, if desired, be both positioned on either of grids 92 or 110 and may also be greater in number. For example, three or four or more of the supports 120 and 122 may be employed.

Each support includes a clamping section 124 having operatively associated therewith a screw 126, the function of which is to tighten the clamping portion 124 on the selected grid. The support 120 or 122 includes an extension 128 supporting a pin 130 upon which the printed circuit is engaged by means of its aligning holes 18.

The supports indicated in FIG. 6 may be permanently arranged on either or both of the respective units, or may be adjustable as illustrated. In any event, the pins 130 are positioned in accordance with the pattern previously determined for the holes 18 of a printed circuit 10.

Inasmuch as the printed circuits are preferably centered between the units 82 and 84, the thickness of extension 128 of each of the supports should be such that the printed circuit is supported in alignment with the pivotal connection between brackets 78 and 80. An extreme leeway intolerance is, of course, permissible by reason of the yieldability of the associated electrodes.

The set up for the electroplating fixture of FIG. 6 may be similar to that employed for the structure of FIG. 2, but alternatively the cover plates 86 and 104 may be retained on the units while the electrodes are being inserted. This is permitted by the flexibility of the associated helical springs, the ends of which are appropriately positioned in the apertures in grids 88 and 106.

In accordance with what has been stated above, it will be clear that a method of the invention may constitute a process for electroplating printed circuits having a plurality of closely spaced platable elements. The method may comprise, for example, simultaneously contacting the elements with individual electrodes and passing an electrical current through the elements. More specifically, the method may comprise yieldably engaging the elements with the electrodes.

In further accordance with the methods of the invention, it is clear that arbitrarily arranged elements of a printed circuit may be plated by a technique whereby a grid-like pattern of guides or guide holes are superposed with respect to the circuit, with electrodes being selectively positioned in the guides and having a yielding abutting relationship with the platable elements.

Moreover, an important technique afforded by the invention is the possibility of providing a complex pattern of electrodes in a manner whereby they are detachable from an associated unit, such that the arrangement of electrodes can be sequentially employed in connection with a large number of like printed circuits.

The invention also contemplates as a technique the provision of alignment holes in printed circuits, whereby the latter may be aligned in like manner on an electroplating fixture.

There will now be obvious to those skilled in the art many modifications and variations of the structures and methods set forth. These modifications and variations will not, however, depart from the scope of the invention as defined in the following claims.

What is claimed is:

1. An electroplating fixture for plating printed circuits each having on a body of insulated material an arbitrary arrangement of conductive elements, said fixture comprising a support including means arranged independently of said arrangement of elements for selectively engaging the bodies of insulative material and holding the same in like alignment, guide means adapted for connection to the support in predetermined relation and defining a pattern of guide channels forming a grid relative to said support, contacts selectively insertable in the channels in accordance with said arrangement and extending towards the support to engage said elements, and an electrically conductive cover plate connected to but spaced from the guide means and constituting a unit therewith, said contacts each comprising an electrically conductive pin insertable through a channel and an electrically conductive spring integral with the pin, the spring being accommodated between the cover plate and guide means to retain the pin in position and to provide for axial displacement of the same, each spring forming a continuous electrical circuit with said cover plate whereby electrical current can be supplied to said elements, and a second guide means hingedly connected to the first said guide means, said support comprising at least one support member connected to one of the guide means 2. An electroplating device for plating a printed circuit having on a body of insulative material spaced platable elements in arbitrary arrangement, said device comprising a guide defining a plurality of apertures in grid-like arrangement, pins selectively insertable through the apertures in correspondence with the elements and constituting contacts for plating the elements, means spaced from and parallel to said guide and supporting said body of insulative material independently of said arrangement, helical springs integral with the pins, electrically conductive means connected to the guide for compressing the springs against the latter for firmly but detachably positioning the pins and forming continuous electrical circuits therewith, a second guide defining a grid-like arrangement of apertures aligned with the first said apertures and means to connect the guides in spaced relation whereby the movement of the pins is restricted.

3. An electroplating device for a flat sheet of insulating material having islands of conductive elements thereupon and defining alignment holes, said device comprising a support member having a flat upper surface, protrusions on said support member for engaging the alignment holes, posts on said support member, and a unit detachably engageable with the posts; said unit comprising a cover plate defining holes for accommodating said posts, at least one grid, means supporting the grid on the cover plate with the grid spaced from the cover plate, pins extending through the grid for engaging the elements, and helical springs integral with the pins and sandwiched between the cover plate and said grid whereby the pins may yieldably engage said elements, the pins being detachable from the grid for selective alignment with the elements; said unit further comprising means for spacing the unit from said support member whereby an electroplating fluid can flow therebetween.

4. An electroplating device for a flat sheet of insulating material having islands of conducting elements on both of its faces and defining alignment holes, said device comprising a hinge member including pivotally connected brackets, and units respectively connected to the brackets for pivotal movement towards and away from each other; each unit comprising a cover plate, a grid, means connecting the grid and cover plate to one of the brackets with the grid spaced from the cover plate and closer to the bracket, pins extending through the grid in alignment with the elements on one of said faces, and helical springs integral with the pins and compressed between the cover plate and grid; said device further comprising support members on at least one of the grids for engaging the alignment holes and supporting the sheet between the units for contact by the pins, and locking means for locking the units together.

5. A method of plating the irregularly arranged elements of a printed circuit comprising forming a grid-like pattern of guides, superposing the pattern with respect to the circuit, selectively guiding contacts by means of the guides into abutting relationship with the elements, immersing the contacts and circuit in an electrolyte, and passing a current through the contacts at a voltage sufficient to cause an electroplating of said elements.

6. A method as claimed in claim 5 comprising detachably locking the contacts to the guides for reuse with a like printed circuit.

7. A method of plating a like arrangement of platable elements on each of a series of bodies of insulative material comprising forming in said bodies like arrangements of aligning means, engaging one of the bodies by means of the aligning means, correlating contacts with the elements on the engaged body, fixing the contacts in their correlated positions, and separately engaging the bodies by means of the aligning means and immersing the contacts and engaged bodies in an electrolyte for electroplating said elements.

(References on following page)

References Cited in the file of this patent

UNITED STATES PATENTS

| | | |
|---|---|---|
| 349,535 | Sohner | Sept. 21, 1886 |
| 2,073,679 | Brown et al. | Mar. 16, 1937 |
| 2,362,228 | Wright | Nov. 7, 1944 |
| 2,389,904 | Hampson | Nov. 27, 1945 |
| 2,475,434 | Moss | July 5, 1949 |

| | | |
|---|---|---|
| 2,479,302 | Bondley | Aug. 16, 1949 |
| 2,721,839 | Taylor | Oct. 25, 1955 |

OTHER REFERENCES

U.S. Dept. of Commerce Publication 192, "New Advances in Printed Circuits," Nov. 22, 1948.

Product Engineering, April 1948, pages 158–160.